United States Patent
Katayama et al.

(10) Patent No.: US 7,534,710 B2
(45) Date of Patent: May 19, 2009

(54) COUPLED QUANTUM WELL DEVICES (CQWD) CONTAINING TWO OR MORE DIRECT SELECTIVE CONTACTS AND METHODS OF MAKING SAME

(75) Inventors: Yasunao Katayama, Tokyo (JP); Dennis M. Newns, Yorktown Heights (JP); Chang C. Tsuei, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 11/315,691

(22) Filed: Dec. 22, 2005

(65) Prior Publication Data

US 2007/0145347 A1    Jun. 28, 2007

(51) Int. Cl.
*H01L 21/8252* (2006.01)
*H01L 29/778* (2006.01)
*H01L 29/88* (2006.01)

(52) U.S. Cl. .................. 438/594; 438/172; 257/25; 257/37; 257/38; 257/E29.042; 257/E29.192; 977/937

(58) Field of Classification Search .................. 438/594
See application file for complete search history.

(56) References Cited

U.S. PATENT DOCUMENTS

| | | | |
|---|---|---|---|
| 5,625,589 A | | 4/1997 | Katayama |
| 5,825,049 A | * | 10/1998 | Simmons et al. ............. 257/25 |
| 2004/0061128 A1 | * | 4/2004 | Pierson et al. ............... 257/183 |
| 2005/0151128 A1 | * | 7/2005 | Augusto ....................... 257/22 |

FOREIGN PATENT DOCUMENTS

| | | |
|---|---|---|
| EP | 0 194 061 A | 9/1986 |
| GB | 2 303 246 | 2/1997 |

OTHER PUBLICATIONS

A. Palevski, et al. "Resistance Resonance in Coupled Potential Wells," *Physical Review Letters*, vol. 65, No. 15, p. 1929.

(Continued)

*Primary Examiner*—Jerome Jackson, Jr.
(74) *Attorney, Agent, or Firm*—Scully, Scott, Murphy & Presser, P.C.; Ido Tuchman, Esq.

(57) ABSTRACT

The present invention relates to a device structure that contains two or more conducting layers, two peripheral insulating layers, one or more intermediate insulating layers, and two or more conductive contacts. The two or more conducting layers are sandwiched between the two peripheral insulating layers, and they are spaced apart by the intermediate insulating layers to form two or more quantum wells. Each of the conductive contacts is directly and selectively connected with one of the conducting layers, so the individual quantum wells can be selectively accessed through the conductive contacts. Such a device structure preferably contains a coupled quantum well devices having two or more quantum wells that can be coupled together by inter-well tunneling effect at degenerate energy levels. More preferably, the device structure contains a memory cell having three quantum wells that can be arranged and constructed to define two different memory states.

11 Claims, 13 Drawing Sheets

OTHER PUBLICATIONS

Y. Katayama, et al. "Lumped Circuit Model of Two-Dimensional to Two-Dimensional Tunneling Transistors," *Appl. Phys. Lett.* vol. 62, No. 20, p. 2563 (1993).

J.A. Simmons, et al. "Unipolar Complementary Bistable Memories Using Gate-Controlled Negative Differential Resistance in a 2D-2D Quantum Tunneling Transiston," International Electron Devices Meeting, 1997, *Technical Digest*, Dec. 7-10, 1997, pp. 755-758;.

J.P. Eisenstein, et al. "Independently Contracted Two-Dimensional Electron Systems in Double Quantum Wells," *Appl. Phys. Lett.* vol. 57, No. 22, p. 2324 (1990).

I.B. Spielman, et al. "Observation of a Linearly Dispersing Collective Mode in a Quantum Hall Ferromagnet," *Physical Review Letters*, vol. 87, No. 3, (2001).

Y. Katayama "New Complementary Logic Circuits using Coupled Quantum Wells," IEEE Nano (2004).

M. Watanabe, et al., "CaF2/CdF2 Double-Barrier Resonant Tunneling Diode with High Room-Temperature Peak-to-Valley Ratio," *Japanese Journal of Appl. Phys.*, vol. 39, Part 2, No. 7B, 716 (2000).

Rubel, H. et al., "Study of the Carrier Density Dependence of the Frictional Drag Between Closely Spaced Two-Dimensional Electron Gases," Semicond. Sci. Technol., 1995, pp. 1229-1232, vol. 10, No. 9.

Rubel H et al. "Fabrication of Independently Contacted and Tuneable 2D-Electron-Hole Systems in GaAs/AlGaAs Double Quantum Wells," Materials Science and Engineering, 1998, pp. 207-211, vol. 51.

Watanabe, M. et al. "CaF2/CdF2 Double-Barrier Resonant Tunneling Diode with High Room-Temeprature Peak-to-Valley Ratio," Jpn. J. Appl. Phys., Jul. 2000, pp. L716-L719, vol. 39, No. 7B, Part 2.

\* cited by examiner

COUPLED QUANTUM WELL DEVICES (CQWD) CONTAINING TWO OR MORE DIRECT SELECTIVE CONTACTS AND METHODS OF MAKING SAME

FIELD OF THE INVENTION

The present invention relates to semiconductor devices and methods of fabricating the same. More particularly, the present invention relates to coupled quantum well devices (CQWD) containing two or more direct and selective contacts, and methods of fabricating such devices.

BACKGROUND OF THE INVENTION

Coupled quantum well devices (CQWD), such as those described, for example, in A. Palevski, et al. "Resistance Resonance in Coupled Potential Wells," Physical Review Letters, Vol. 65, No. 15, pg. 1929 (1990), Y. Katayama, et al. "Lumped Circuit Model of Two-Dimensional Tunneling Transistors," Appl. Phys. Lett. Vol. 62, No. 20, pg. 2563 (1993), J. A. Simmons, et al. "Unipolar Complementary Bistable Memories Using Gate-Controlled Negative Differential Resistance in a 2D-2D Quantum Tunneling Transistor," International Electron Devices Meeting, 1997, Technical Digest, Dec. 7-10, 1997, pgs. 755-758, J. P. Eisenstein, et al. "Independently Contracted Two-Dimensional Electron Systems in Double Quantum Wells," Appl. Phys. Lett. Vol. 57, No. 26, p. 2324 (1990), and I. B. Spielman, et al. "Observation of a Linearly Dispersing Collective Mode in a Quantum Hall Ferromagnet," Physical Review Letters, Vol. 87, No. 3, (2001), are tunneling devices that can operate at very low voltages (e.g., 0.1V to 0.3V), which yield major advantages in terms of power consumption and are interesting to investigate in order to evaluate their potential.

In its simplest, two-layer form, a CQWD contains two quantum well layers that are separated by a thin barrier layer. Each quantum well layer includes a very thin sheet of 2-dimensional electron gas (2DEG) that lies in the xy plane. The two 2DEG sheets are superimposed at different positions along the z axis, with a narrow tunneling gap between them. When the energy levels in these two 2DEG sheets are degenerate (i.e., their quantum states share the same quantum numbers), they are coupled strongly due to the inter-sheet tunneling effect. When the energy levels are not equal, tunneling coupling falls off, and the energy difference becomes comparable with the inter-sheet matrix element, forming a simple switching device. For more details relating to the two-layer CQWD structure, see the articles by Palevski, et al., Katayama, et al and J. A. Simmons, et al. as mentioned hereinabove.

Three-layer CQWD structures have been shown to constitute a latch, which can form the basis of logic and memory circuitry. This is described, for example, in U.S. Pat. No. 5,625,589 issued to Katayama on Apr. 29, 1997 for "Static Memory Cell with Spaced Apart Conducting Layers," and Y. Katayama "New Complementary Logic Circuits using Coupled Quantum Wells," IEEE Nano (2004).

CQWDs, which use quantization of single particle states locally, constitute a preliminary step towards computing with quantum systems.

Further, it has been discovered that fundamental physics is involved at low temperature in CQWDs under appropriate conditions (see, the articles to I. B. Spielman et al. and Eisenstein, et al. mentioned above), and this will be another promising field for future investigation.

However, in the prior art CQWD structure, the multiple quantum well layers are typically connected in parallel, i.e., by the same set of electrodes that simultaneously contact all the quantum well layers, due to difficulties in making selective contact to the individual quantum wells. The quantum wells are either operated in parallel, or series operation can be indirectly achieved by using additional top and bottom turn-off electrodes.

For example, FIG. 1A illustrates a prior art CQWD structure 10 with two quantum well layers 12 and 14, which are spaced apart by a very thin barrier layer 16. Suitable doping is provided to establish a 2DEG sheet in each well. Standard diffused-in contacts 18 and 20 are provided, each of which contacts both quantum well layers 12 and 14 simultaneously. Additional turn-off electrodes 22 and 24 are respectively fabricated on the top and bottom surfaces of the CQWD structure. Application of a negative bias potential $V_t$ to the top turn-off electrode 22 will result in depletion of the electrons within the quantum well regions that are underneath the electrode 22. For small $-V_t$, the depletion only occurs within a region in the upper quantum well layer 12. Continued increase of $-V_t$ can eventually fully deplete the upper quantum well layer 12 and begin depletion of the lower quantum well layer 14. Therefore, a range of top turn-off bias voltages exists in which the two ohmic contacts 18 and 20 are electrically connected together only via the lower quantum well layer 14. In exact analogy, the bottom turn-off electrode 24 can be negatively biased by a voltage $-V_b$, so that the lower quantum well layer 14 above it is fully depleted but the upper quantum well layer 12 is not. In such a manner, the top and bottom turn-off electrodes 22 and 24 can be suitably biased to provide a condition in which the contacts 18 and 20 are electrically disconnected from each other by the depleted regions in the upper and lower quantum well layers 12 and 14, as shown in FIG. 1B. When the energy levels in the upper and lower quantum well layers 12 and 14 are degenerate, electrons can flow from contact 18 to contact 20, or vise versa, through un-depleted regions in the quantum well layers 12 and 14 and across the barrier layer 16 via tunneling effect, as indicated by the arrowheads in FIG. 1B.

In the prior art CQWD structure illustrated by FIGS. 1A and 1B, the contacts 18 and 20 are not selectively contacted with the individual quantum well layers 12 and 14. Instead, they are simultaneously contacted with both quantum wells, and the top and bottom turn-off electrodes 22 and 24 must be employed to selectively deplete regions in the quantum well layers 12 and 14, in order to indirectly establish selective electrical connection between contacts 18 and 20 and quantum well layers 14 and 12, respectively.

The top and bottom turn-off electrodes of the prior art CQWD are functionally and structurally clumsy. Further, they are limited to 2-layer structures, which is not suitable for computer applications.

SUMMARY OF THE INVENTION

The present invention provides direct and selective contacts for individual quantum wells in device structures that contain multiple quantum wells, such as CQWDs.

In one aspect, the present invention relates to a device structure that contains: (i) two or more conducting layers; (ii) two peripheral insulating layers; (iii) one or more intermediate insulating layers; and (iv) two or more conductive contacts.

The two or more conducting layers are sandwiched between the two peripheral insulating layers and spaced apart from one another by the one or more intermediate insulating layers. The conducting layers form quantum wells for quantum-mechanical confinement of free electrons therein, and each of the two or more conductive contacts is directly and selectively connected with one of the conducting layers.

Unlike the prior art CQWD structure shown in FIGS. 1A and 1B, the device structure of the present invention does not contain any top or bottom turn-off electrode, and is therefore particularly suitable for uses in computer circuits.

Preferably, the device structure of the present invention has a first surface and a second, opposite surface, and the conductive contacts in the device structure each have a terminal that is located on the first surface, but not the second surface, of the device structure. In such an event, the quantum wells embedded in the device structure can be directly and selectively accessed from one side of the device structure, which further reduces the amount of interconnects required for integrating such a device structure into a computer circuit and simplifies the overall structure.

In its simplest form, the device structure of the present invention may be a two-layer structure that comprises two conducting layers separated by one intermediate insulating layer, with two conductive contacts that each directly and selectively connects with one of the two conducting layers. Alternatively, the device structure of the present invention may be a three-layer structure that comprises three conducting layers separated by two intermediate insulating layers, with three conductive contacts that each directly and selectively connects with one of the three conducting layers. Further, the device structure may comprise four, five, six, or even a greater number of conducting layers, which are separated by a plurality of intermediate insulating layers. The exact number of conducting layers in the device structure of the present invention is determined by its specific application.

The device structure of the present invention preferably comprises a CQWD, but alternatively, it may comprise any other quantum-well-based structure that contains multiple quantum well layers, including, but not limited to: quantum well lasers, quantum well photodetectors, quantum well solar cells, light-emitting diodes containing multiple quantum wells, quantum well micro-resonators, etc. More preferably, the device structure comprises a static memory cell, which uses alternatively coupled quantum wells for information storage, which will be described in greater details hereinafter.

In another aspect, the present invention relates to a method for forming a device structure as described hereinabove by:
  providing a precursor structure that contains: (i) two or more conducting layers, (ii) two peripheral insulating layers, and (iii) one or more intermediate insulating layers, where the two or more conducting layers are sandwiched between the two peripheral insulating layers and spaced apart from one another by the one or more intermediate insulating layers, forming two or more quantum wells for quantum-mechanical confinement of free electrons; and
  fabricating two or more conductive contacts in the precursor structure, wherein each of the conductive contacts is directly and selectively connected with one of the two or more conducting layers, thereby forming a device structure having direct and selective contacts for quantum wells.

In a specific embodiment of the present invention, a process that includes a combination of lithography, ion milling/reactive ion etching (RIE), selective wet etching, and oblique angle thin-film deposition steps is employed for fabricating conductive contacts in a precursor structure that contains GaAs/GaAlAs-based quantum wells.

In another specific embodiment, a process that includes a combination of lithography, ion milling/RIE, and thin-film regrowth steps is employed for fabricating conductive contacts in a precursor structure that contains $CdF_2/CaF_2$-based quantum wells.

In a still further aspect, the present invention relates to a coupled quantum well structure that contains: (i) two or more quantum wells that are arranged and constructed for tunneling coupling at degenerate energy levels, and (ii) two or more conductive contacts, each of which is directly and selectively connected with one of the quantum wells.

In yet another aspect, the present invention relates to a memory cell that contains:
  a plurality of insulating layers;
  at least first, second and third conducting layers spaced apart by the insulating layers, wherein quantum-mechanical confinement of free electrons exists in each of the first, second and third conducting layers;
  at least first, second and third electrodes, which are directly and selectively contacted with the first, second and third conducting layers respectively;
  a first voltage applicator for applying a predetermined voltage between the first and third conducting layers through the first and third electrodes, in such a manner that no tunneling current flows directly between the first and third conducting layers; and
  a second voltage applicator for applying a variable voltage to the second conducting layer through the second electrode, in such a manner that a tunneling current can flow either between the first and second conducting layers, defining a first memory state, or between the second and third conducting layers, defining a second, different memory state.

Other aspects, features and advantages of the invention will be more fully apparent from the ensuing disclosure and appended claims.

DETAILED DESCRIPTIONS OF THE INVENTION, AND PREFERRED EMBODIMENTS THEREOF

Figure 1A:
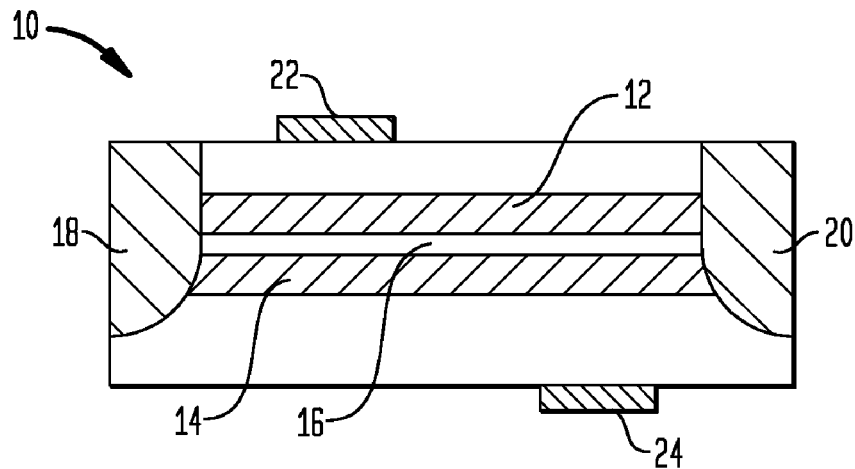
FIGS. 1A and 1B shows an exemplary prior art CQWD structure that contains top and bottom turn-off electrodes for selective depletion of quantum wells.
Figure 1B:
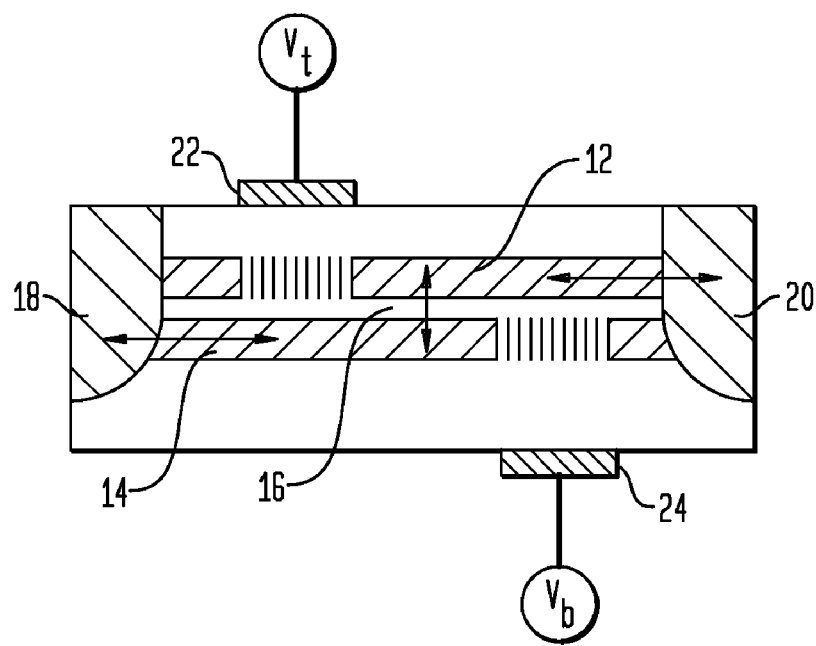

U.S. Pat. No. 5,625,589 issued on Apr. 29, 1997 to Katayama for "Static Memory Cell with Spaced Apart Conducting Layers" is incorporated herein by reference in its entirety for all purposes.

The phrase "direct and selective contact," "direct and selective contacts," "directly and selectively contacted," or "directly and selectively contacted" as used herein refers to an electrode or an electric conductor that is in direct, physical contact with a specific conducting layer, but is completely isolated from, and does not in any manner touch, or make any physical contact with, any other conducting layer or any portion thereof.

The term "substantially aligned" as used herein refers to alignment of two layers or two surfaces along a specific direction, with an offset of less than ±30 Å along the specific direction.

The device structure of the present invention contains two or more conducting layers sandwiched between two peripheral insulating layers and further spaced apart from one another by one or more intermediate insulating layers. Each conducting layer forms a quantum well, i.e., it is arranged and constructed in conjunction with its adjacent insulating layers for quantum-mechanically confining free electrons in one dimension, forcing them to occupy a planar region within or near the conducting layer. The width of this region is on the order of the de Broglie wavelength of the electrons, leading to quantized sub-bands. By doping an adjacent insulating layer with donor impurities, a 2DEG can be formed.

The term "conducting" and "insulating" are used herein in a relative sense, i.e., insulating layers or insulating materials are characterized by wider band gaps than those of the conducting layers or conducting materials. Therefore, in the present invention, what is normally considered a semiconductor can be referred to herein as either a conducting layer or a conducting material, if it is adjacent to a material layer of a wider band gap, or an insulating layer or an insulating material, if it is adjacent to a material layer of a narrower band gap.

The conducting layers and the insulating layers may comprise any suitable materials, such as group IV semiconductors (which include, but are not limited to: Si, Ge, C, SiGe, SiC, etc.), groups III-V, II-VI, and IV-V compound semiconductors (which include, but are not limited to: GaAs, GaAlAs, GaAlAsSb, GaAsSb, GaAlPSb, GaAlSb, GaAlInSb, GaSb, InAs, InAlAs, InGaAs, InGaP, InP, InAsP, InAlAsSb, InAlSb, InAsSb, InSb, AlAs, AlAsSb, AlSb, TlInP, TlInGaP, TlInGaAs, AlInAs, AlInAsSb, GaN, AlGaN, and InGaN, InGaAlN, InN, AlN, CdS, CdTe, CdHgTe, ZnS, ZnSe, ZnSSe, PbSe, PbTe, PbSSe, etc.), and fluoride compounds (including, but not limited to $CdF_2$ and $CaF_2$).

The conducting/insulating layers preferably comprise materials selected from the group III-V compound semiconductor family which consists of: GaAs/AlGaAs, GaAs/GaInP, GaAs/AlAs, GaInAs/AlGaAs(AlAs, GaInP), InAsP/AlInAs, InAsP/AlGaAsSb, GaInAs/AlInAs (AlAsSb, AlInAsSb, AlGaAsSb, InP), TlInP(TlGaInP, TlGaInAs)/AlInAs(AlAsSb, AlInAsSb, AlGaAsSb,InP,AlGaPSb), GaAsSb/InP(AlInAs, AlAsSb, AflnAsSb, AlGaAsSb, AlGaPSb), InAs/AlGaAsSb(AlSb, AlAsSb, AlGaSb), GaSb/AlGaAsSb(AlSb, AlAsSb, AlGaSb), InAsSb/AlGaInSb, InSb/AlInSb, GaN/AlGaN(AlN), and GaInN/AlGaN(AlN). Note that the materials for forming the conducting layers are identified herein before the forward slash, while the materials for forming the insulating layers are identified herein after the forward slash. More preferably, the device structure of the present invention comprises GaAs-based conducting layers and GaAlAs-based insulating layers.

Recent studies have shown that fluoride compounds such as $CdF_2$ and $CaF_2$ are promising materials for fabricating $CdF_2/CaF_2$-based quantum well and barrier structures on a Si substrate, which is described, for example, in M. Watanabe, et al., "$CaF_2/CdF_2$ Double-Barrier Resonant Tunneling Diode with High Room-Temperature Peak-to-Valley Ratio," Japanese Journal of Appl. Phys., Vol. 39, Part 2, No. 7B, 716 (2000). Therefore, a preferred embodiment of the present invention provides a device structure that contains multiple $CdF_2$-based conducting layers that are isolated by $CaF_2$-based insulating layers.

The device structure of the present invention is supported by a suitable substrate, which may comprise a substrate material such as Si, GaAs, InP, GaN, AlN, SiC and sapphire. In one embodiment of the present invention, the substrate contains semi-insulating GaAs for supporting GaAs/GaAlAs-based quantum well structures. In an alternative embodiment, the substrate contains Si for supporting $CdF_2/CaF_2$-based quantum well structures.

Typically, the conducting and the peripheral insulating layers have an average thickness of from about 5 Å to about 500 Å, and the intermediate insulating layers have an average thickness of from about 5 Å to about 200 Å. However, it is noted that thickness of the conducting and insulating layers may differ significantly for the GaAs/GaAlAs-based structures and the $CdF_2/CaF_2$-based structures.

For example, in the GAs/GaAlAs-based structures, the conducting layers are preferably characterized by an average thickness from about 30 Å to about 300 Å, more preferably about 140 Å. The two peripheral insulating layers are preferably characterized by an average thickness from about 100 Å to about 500 Å, more preferably about 250 Å. Moreover, each of the peripheral insulating layers preferably contains a thin layer of dopant for forming the 2DEG sheets. The intermediate insulating layers are preferably characterized by an average thickness from about 20 Å to about 100 Å, more preferably about 40 Å.

In the $CdF_2/CaF_2$-based structures, the conducting layers are preferably characterized by an average thickness from about 10 Å to about 80 Å, more preferably about 40 Å. The two peripheral insulating layers are preferably characterized by an average thickness from about 100 Å to about 500 Å, more preferably about 250 Å. The intermediate insulating layers are preferably characterized by an average thickness from about 5 Å to about 20 Å, more preferably about 9 Å.

The device structure of the present invention contains direct and selective contacts to the individual conducting layers. Such contacts may comprise any suitable conductive material, including, but not limited to: Cu, Al, Au, Ag, Pt, Ni, Ti, Zn, Pd, and alloys thereof. In a preferred embodiment of the present invention, such contacts comprise GeAuNi alloy for n-type GaAs conducting layers.

Direct and selective contacts to the conducting layers (i.e., the quantum wells) should provide selective electrical access to each individual conducting layer, without disrupting its wave functions.

The present invention in one aspect employs a combination of lithography, ion milling/reactive ion etching (RIE), selective wet etching, and oblique angle thin-film deposition process steps for fabricating conductive contacts in a precursor structure that contains GaAs/GaAlAs-based quantum wells or similar types of quantum well structures.

Figure 2A:
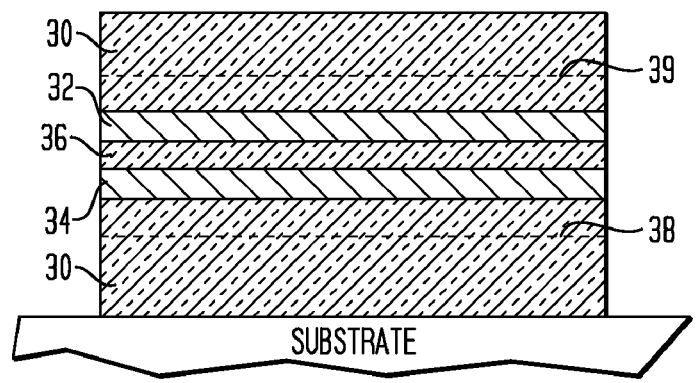
FIGS. 2A-2I illustrates the processing steps for fabricating a conductive contact that is directly and selectively connected with a bottom quantum well layer of a two-layer CQWD structure, according to one embodiment of the present invention.

FIG. 2A shows an exemplary precursor structure, as supported by a substrate. The precursor structure contains a top conducting layer 32 and a bottom conducting layer 34, which are sandwiched between, or flanked by, two peripheral insulating layers 30. The top and bottom conducting layers 32 and 34 form two quantum wells for quantum-mechanical confinement of free electrons. An intermediate insulating layer 36 forms a tunneling barrier between the top and bottom conducting layers 32 and 34. The tunneling barrier 36 is sufficiently thin to allow electrons to flow therethrough via tunneling effect when the energy levels in the top and bottom conducting layers 32 and 34 are degenerate. Further, the two peripheral insulating layers 30 each contains a layer of dopant, as indicated by the dotted lines 38 and 39.

In a particularly preferred embodiment of the present invention, each of the top and bottom conducting layers 32 and 34 contains GaAs material and has a thickness of about 140 Å. The two peripheral insulating layers 30 each has a thickness of about 1750 Å, and the intermediate insulating 36 has a thickness of about 40 Å. The peripheral and intermediate insulating layers 30 and 36 both contain $Ga_xAl_yAs$, where $0<x,y<1$, and more preferably x is about 0.7 and y is about 0.3. The dopant layers 38 and 39 in the peripheral insulating layers 30 are respectively spaced apart from the adjacent conducting layers 34 and 32 by a distance of approximately 250 Å, and more preferably, the dopant layers each has a silicon dopant concentration of about $7\times10^{11}/cm^2$. The substrate supporting such a GaAs/GaAlAs-based precursor structure preferably comprises semi-insulating GaAs.

In an alternative embodiment of the present invention, the thickness of the GaAs conducting layers is about 80 Å, and additional AlAs layers of about 12 Å in thickness are added above and below the GaAs conducting layers, thus making the quantum confinement considerably stronger, because the level spacing from ground to first excited state is increased by more than 3 times.

Figure 2B:
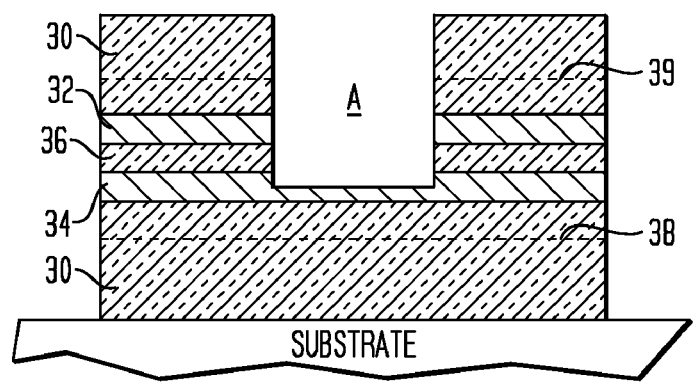

The fabrication process starts with selective etching of the precursor structure to form a pit A in the precursor structure, by removing a portion of the upper peripheral insulating layer 30, the top conducting layer 32, and the intermediate peripheral insulating layer 36. The bottom of pit A exposes an upper surface of the bottom conducting layer 34, and the sidewalls of pit A exposes the top conducting layer 32 and the intermediate peripheral insulating layer 36, as shown in FIG. 2B. Preferably but not necessarily, pit A has a width in a range from about 500 Å to about 1000 Å.

The selective etching can be readily carried out by: (1) forming a patterned mask layer on a predetermined region of the precursor structure to protect this region from subsequent etching, while leaving the region where pit A is to formed unprotected, and (2) using dry etching techniques, such as ion milling or reactive ion etching (RIE), to remove a portion of the upper peripheral insulating layer 30, the top conducting layer 32 and the intermediate peripheral insulating layer 36 in the unprotected region of the precursor structure, thereby forming pit A.

The patterned mask layer can be formed by suitable lithographic techniques; Specifically, a photoresist layer is deposited on the upper surface of the precursor structure. A patterned electron beam is then impinged on the photoresist layer, in such a manner that a portion of the photoresist layer in the region where pit A is to be formed is exposed to the patterned electron beam and becomes soluble or etchable, while the remaining portion of the photoresist layer is not. By removing the soluble or etchable portion of the photoresist material with a suitable solvent or etchant, the region of the precursor structure where pit A is to be formed becomes exposed for subsequent etching. After pit A is formed, the patterned mask layer can then be removed from the precursor structure by utilizing a conventional resist stripping process.

The dry etching step as described hereinabove is preferably coupled with a residue gas analyzer (RGA). The RGA analyzes the etched material during the dry etching process. Therefore, when an etching endpoint for the intermediate insulating layer 36 is reached, a sharp change in the RGA signal will be generated, which can be used in conjunction with an empirically determined etching time that is required for etching through the upper peripheral insulating layer 30, the top conducting layer 32 and the intermediate peripheral insulating layer 36, for precise control of the etching process.

Although ion milling and RIE are identified as the preferred techniques hereinabove, the selective etching process of the present invention can be carried out, without limitation, by any other dry etching technique, such as plasma etching or laser etching, or by a wet etching process in which a chemical etchant is employed, or by any combination thereof. Such selective etching may be performed utilizing a single etching process or multiple etching steps.

Figure 2C:
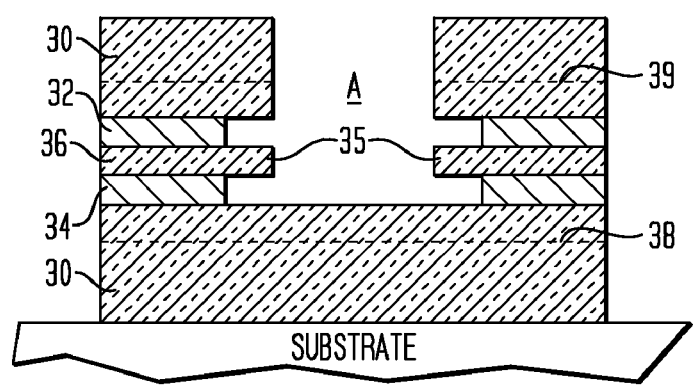
Figure 2D:
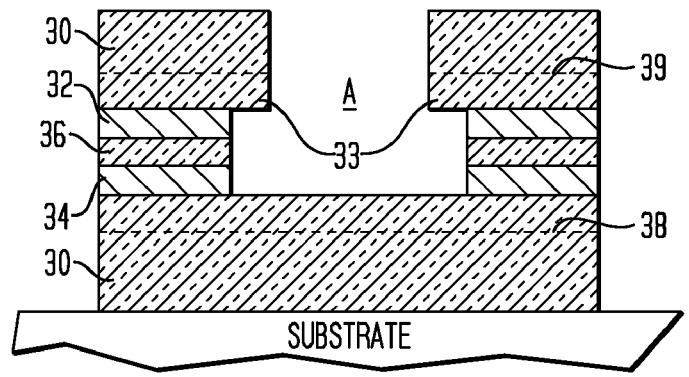

Ion milling or RIE may create disordered etching surfaces on the conducting layers. Therefore, a two-step selective etching process is subsequently carried out. Specifically, a first etching solution is used to first selectively remove the atomically disordered etching surfaces from the conducting layers 32 and 34, exposing the upper surface of the bottom peripheral insulating layer 30 and forming recesses in the atomically ordered conducting layers 32 and 34 (see FIG. 2C). Subsequently, a second etching solution is used to selective etch the intermediate insulating 36, thereby removing protrusions or shelves 35 as formed by the unetched edges of the intermediate insulating 36 (see FIG. 2C). Consequently, pit A is expanded and now contains a narrower, upper portion and a wider, lower portion separated by a projecting edge 33 therebetween, as shown in FIG. 2D.

Preferably, when the conducting layers comprise GaAs, and the intermediate insulating layer comprises GaAlAs, the first etching solution comprises buffered oxide etchant (BOE), which selectively etches GaAs, and the second etching solution comprises hydrogen fluoride, which selectively etches GaAlAs. Other etching solutions well known in the art can also be used for selective etching of the conducting and insulating layers, depending on the specific materials used for forming the conducting and insulating layers.

After formation of the expanded pit A, a thin layer of a contact material 42 is deposited over the bottom peripheral insulating layer 30 in pit A. Any suitable contact material may be employed in the practice of the present invention, including, but not limited to: Cu, Al, Au, Ag, Pt, Ni, Ti, Zn, Pd, and alloys thereof. In a preferred embodiment of the present invention, GeAuNi alloy is used as the contact material for a GaAs/GaAlAs-based precursor structure.

Figure 2E:
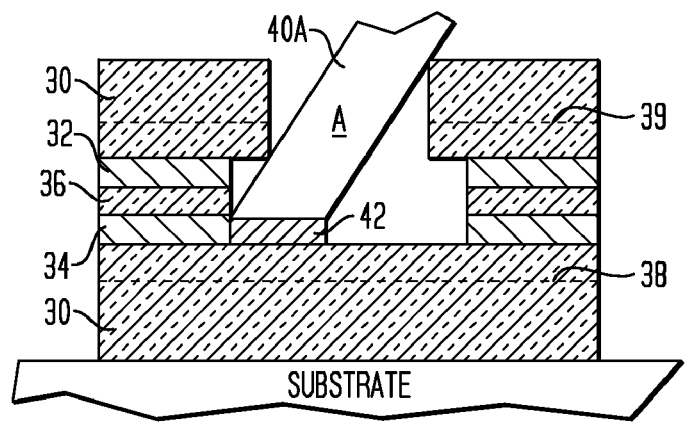
Figure 2F:
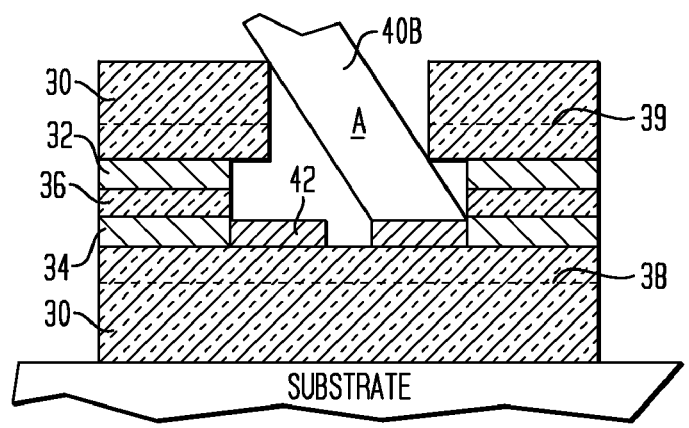
Figure 2G:
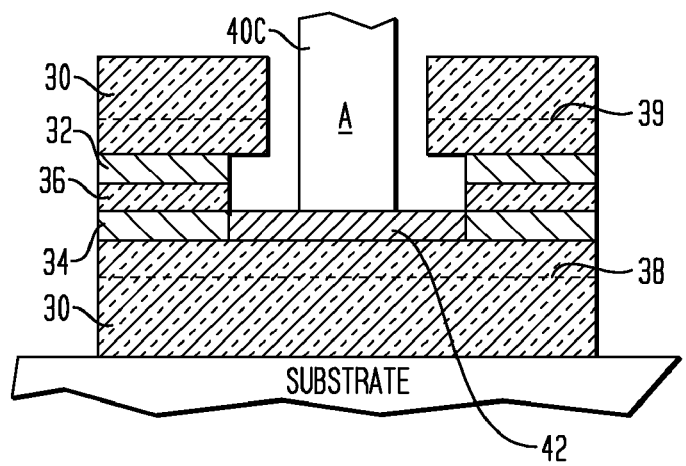

In a preferred embodiment of the present invention, the contact material layer 42 is formed by using oblique angle thin-film deposition techniques, in which an angled, collimated deposition beam or flux is used to deposit the contact material in pit A. The projecting edges 33 between the narrower, upper portion and the wider, lower portion of pit A limits the reach of the angled depositions beam to levels below the upper surface of the bottom conducting layer 34, thereby providing an effective deposition stop for preventing excessive deposition of the contact material. The complete contact material layer 42 can be deposited by using a top left to bottom right deposition 40A, a top right to bottom left deposition beam 40B, and a vertical deposition beam 40C, as shown in FIGS. 2E-2G.

Note that the contact material layer 42 does not have to have a perfectly even thickness throughout, and some areas of this layer can be significantly thicker than others. Good electrical contact between the contact material layer 42 and the bottom conducting layer 34 is established as long as the edges of these two layers are substantially aligned.

In the GaAs/GaAlAs embodiment, the average thickness of the contact material layer 42 ranges from about 50 Å to about 150 Å. Preferably, but not necessarily, the contact material layer 42 has an average thickness that is substantially similar to that of the bottom conducting layer 34, so the contact material layer 42 can be substantially aligned with the bottom conducting layer 34, as shown in FIG. 2G.

Figure 2H:
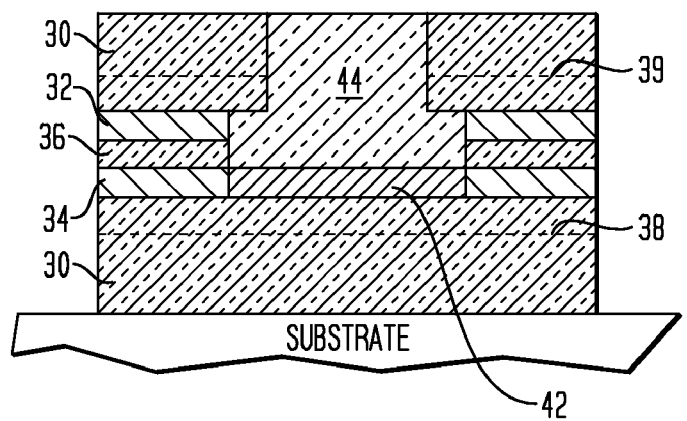
Figure 2I:
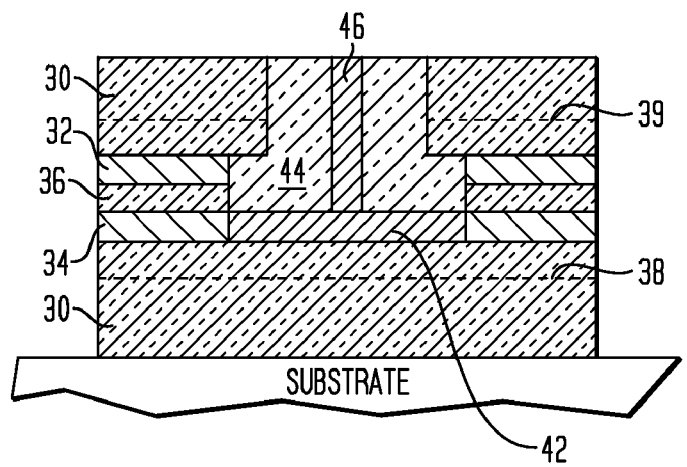

After the contact material layer 42 is deposited, pit A is filled with a dielectric material, such as $SiO_2$, to form a dielectric filling 44 that isolates the contact material layer 42 from the top conducting layer 32, as shown in FIG. 2H. Subsequently, the dielectric filling 44 is selectively etched, by using lithography and ion mill/RIE techniques or other selective etching techniques as described hereinabove for forming pit A, to form an isolated via opening in the dielectric filling 44 and to expose the upper surface of the contact material layer 42. The isolated via opening is then filled with a contact material similar to that use for forming the contact material layer 42, thereby forming a T-shaped conductive contact 46 with an extended bottom portion 42, as shown in FIG. 2I.

Contact 46 is directly connected with the bottom conducting layer 34, but is isolated from the top conducting layer 32 by the dielectric filling 44. Therefore, contact 46 constitute a direct and selective contact to the bottom conducting layer 34.

A direct and selective contact to the top conducting layer 32 can be fabricated by using similar techniques as described hereinabove.

Figure 3A:
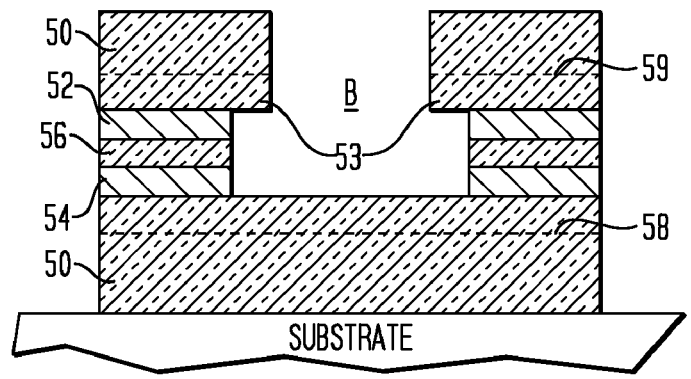
FIGS. 3A-3F illustrates the processing steps for fabricating a conductive contact that is directly and selectively connected with a top quantum well layer of a two-layer CQWD structure, according to one embodiment of the present invention.

Specifically, an extended pit B, similar to the extended pit A in FIG. 2D, can be formed in a precursor structure that contains a top conducting layer 52 and a bottom conducting layer 54, which are sandwiched between or flanked by two peripheral insulating layers 50. The top and bottom conducting layers 52 and 54 form two quantum wells for quantum-mechanical confinement of free electrons, which are separated from each other by a thin intermediate insulating layer 56. The extended pit B specifically contains a narrower, upper portion and a wider, lower portion, with projecting edges 53 therebetween, as shown in FIG. 3A.

Figure 3B:
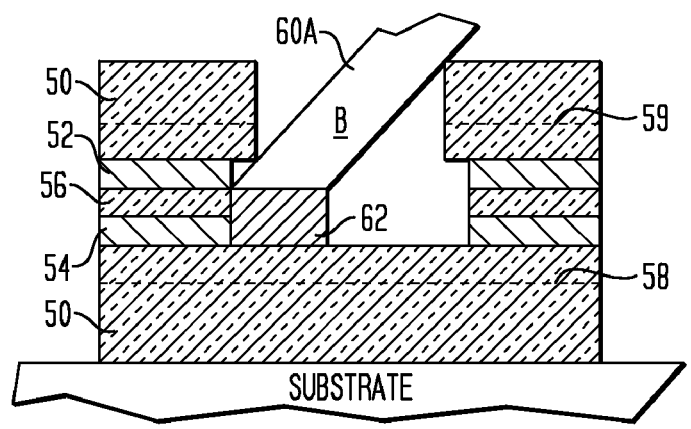
Figure 3C:
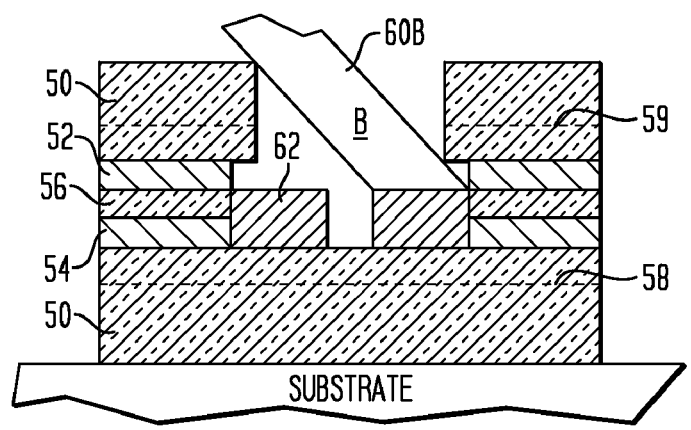
Figure 3D:
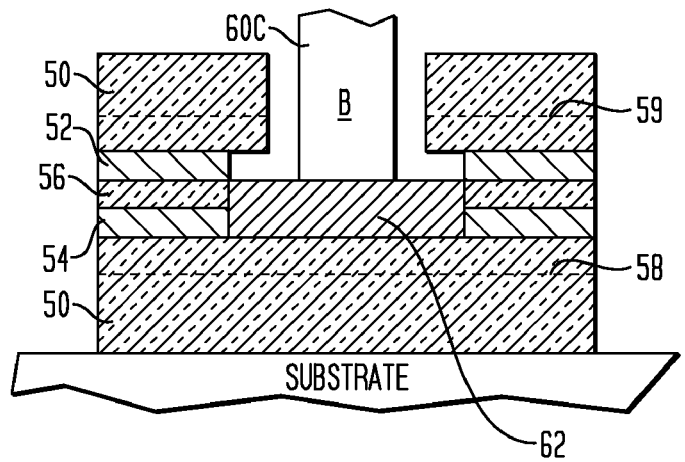

A thick layer of a dielectric material, such as $SiO_2$, is deposited over the bottom peripheral insulating layer 50 in pit B. In a preferred embodiment of the present invention, using oblique angle thin-film deposition techniques as described hereinabove forms the dielectric material layer. Specifically, the projecting edges 53 between the narrower, upper portion and the wider, lower portion of pit B limits the reach of an angled, collimated deposistion beam to levels below the lower surface of the top conducting layer 52, thereby providing an effective deposition stop for preventing excessive deposition of the dielectric material. A complete contact material layer 62 can be deposited by using a top left to bottom right deposition 60A, a top right to bottom left deposition beam 60B, and a vertical deposition beam 60C, as shown in FIGS. 3B-3D.

Note that the dielectric material layer 62 does not have to have a perfectly even thickness throughout, and some areas of this layer can be significantly thicker than others. Good electrical insulation of the top conducting layer 52 is established as long as the edges of the dielectric material layer 52 is substantially aligned with the lower surface of the top conducting layer 52.

In the GaAs/GaAlAs embodiment the average thickness of the dielectric material layer 62 is from about 60 Å to about 300 Å, more preferably from about 150 Å. Preferably, but not necessarily, the contact material layer 42 has an average thickness that is substantially similar to the total thickness of the bottom conducting layer 54 and and the intermediate insulating layer 56, so the dielectric material layer 62 can be substantially aligned with the the bottom conducting layer 54 and and the intermediate insulating layer 56, as shown in FIG. 3D.

Figure 3E:
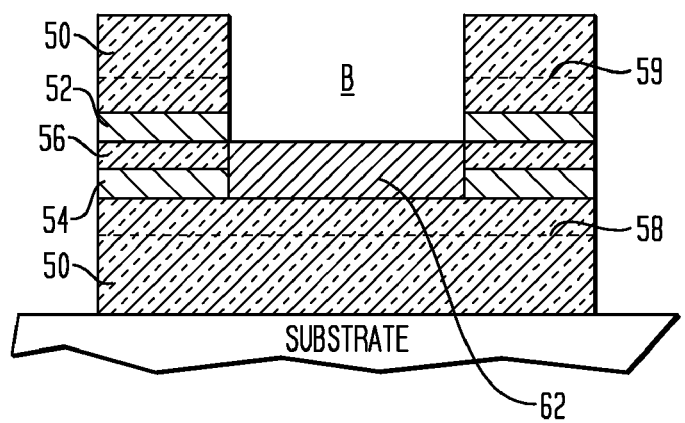

Subsequently, a wet etching solution is used to selectively remove a portion of the top peripheral insulating layer 50, to expand the narrower upper portion of the expanded pit B and form a further expanded pit with substantially straight sidewalls devoid of any projecting edge, as shown in FIG. 3E. In a GaAs/GaAlAs-based system, the wet etching solution preferably comprises hydrogen fluoride, which selectively etches GaAlAs without damage the GaAs material. Other etching solutions well known in the art can also be used for selective etching of the top peripheral insulating layer 50, depending on the specific materials used for forming the conducting and insulating layers.

Figure 3F:
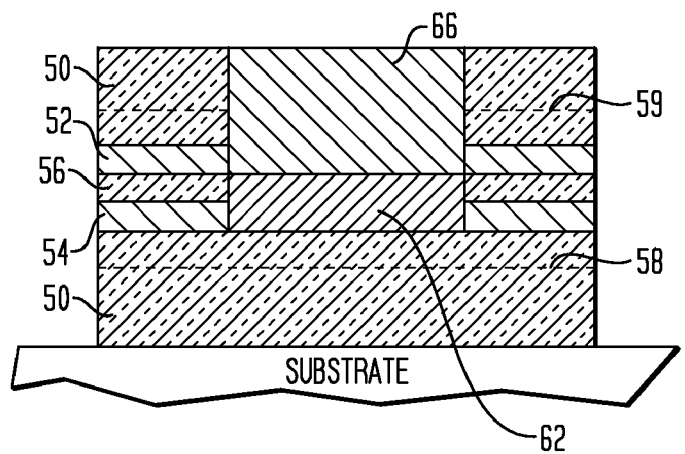

The expanded pit B as shown in FIG. 3E is then filled with a contact material as described hereinabove to form a conductive contact 66, as shown in FIG. 3F.

Contact 66 is directly connected with the top conducting layer 52, but is isolated from the bottom conducting layer 54 by the dielectric material layer 62. Therefore, contact 66 constitute a direct and selective contact to the top conducting layer 52.

Figure 4A:
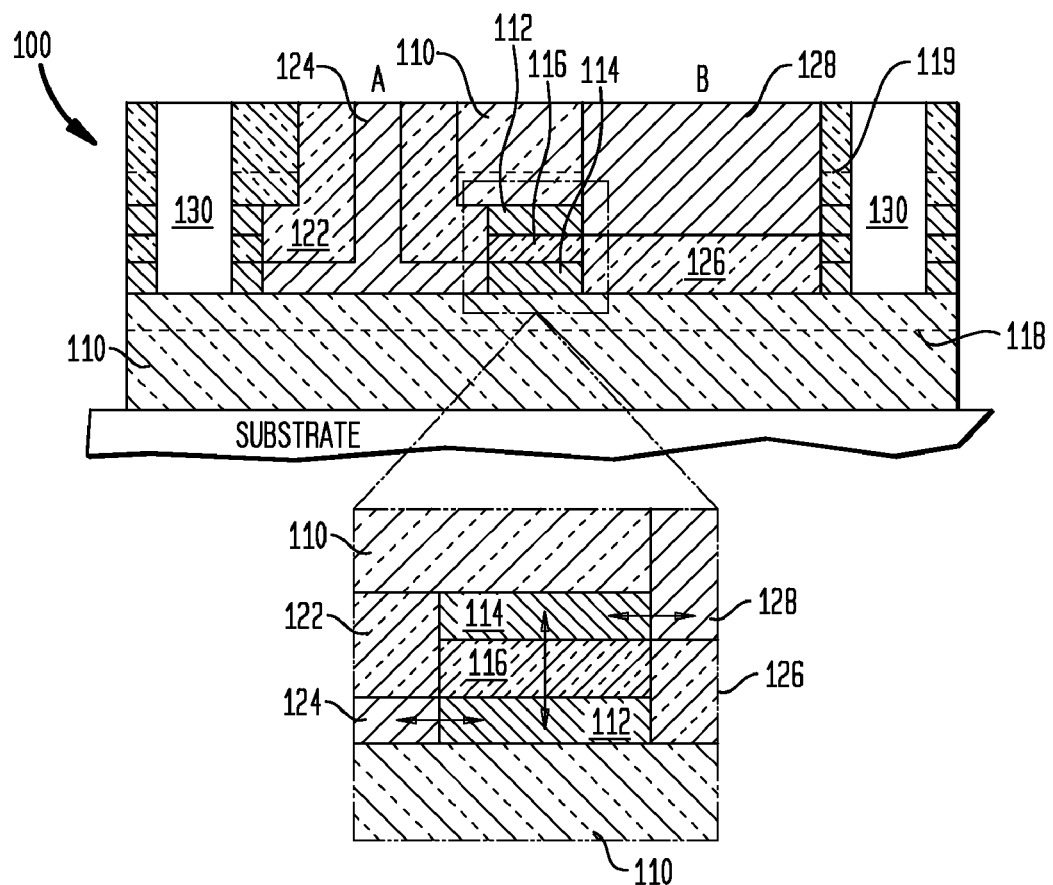
FIG. 4A shows the cross-sectional view of an exemplary two-layer CQWD structure, according to one embodiment of the present invention.

The upper portion of FIG. 4A shows the cross-sectional-view of a complete 2-layer device structure, which contains a top conducting layer 112 and a bottom conducting layer 114 as sandwiched between a top and bottom peripheral insulating layers 110 (with thin dopant layers 118 and 119 therein) and separated from each other by an intermediate insulating layer 116. Conductive contacts 124 and 128 provide direct and selective connection to the bottom and top conducting layers 114 and 112, respectively. More importantly, contact 124 is isolated from the top conducting layer 112 by a dielectric filling 122, and contact 128 is isolated from the bottom conducting layer 114 by a dielectric material layer 126.

As shown in the expanded view in the lower portion of FIG. 4A, electrons can flow between the contacts 124 and 128 through the conducting layers 112 and 114 and across the thin intermediate insulating layer 116 via tunneling effect, when the energy levels of the top and bottom conducting layers 112 and 114 are degenerate.

Further, as shown in FIG. 4A, isolation trench 130 can be formed around the 2-layer device structure. The isolation trench 130 is formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric.

Figure 4B:
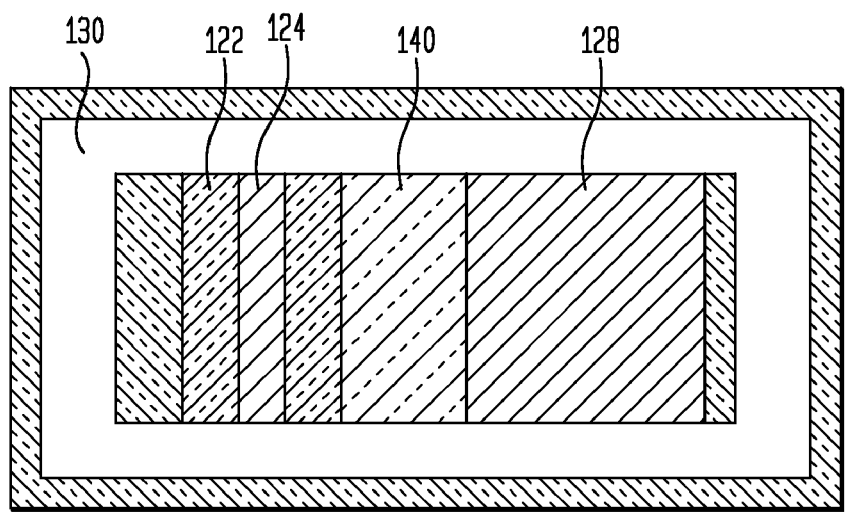
FIG. 4B shows the top view of the two-layer CQWD structure of FIG. 4A.

FIG. 4B shows a top view of the 2-layer device structure of FIG. 4A. Rectangular region 140 between contacts 124 and 128 contains overlapping regions in the top conducting layer 112 and the bottom conducting layer 114, therefore defining the active region of the 2-layer device structure. Preferably, the active region 140 and the contacts 124 and 128 are about 500-2000 Å long, more preferably about 1200-1800 Å long, and most preferably about 1500 Å. The width of the active region 140 will depend on load matching.

Because both contacts 124 and 128 are on the upper surface of the 2-layer device structure, co-planar connectors or terminals for the nanoscopic contacts 124 and 128 can be easily fabricated by standard lithographic techniques. More importantly, device structures with co-planar connectors and terminals can be readily integrated into logic circuitry, with minimum amount of modification to the existing circuitry, and are particularly suitable for computer applications.

The techniques as described hereinabove can be readily applied for fabricating three-, four-, five-, or six-layer device structures.

Figure 5:
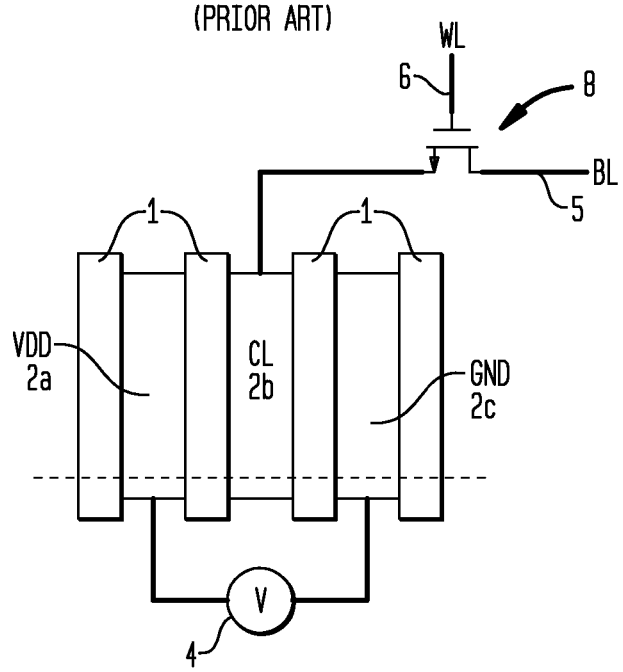
FIG. 5 shows a prior art static memory cell that contains three quantum well layers, as described in U.S. Pat. No. 5,625,589.

For example, U.S. Pat. No. 5,625,589 describes a static memory cell that comprises three conducting layers 2a, 2b, and 2c, which are spaced apart by insulating layers 1, as shown in FIG. 5. Free electrons in these three conducting layers are quantum-mechanically confined. Between the conducting layers 2a and 2c, a constant voltage is applied so that no tunneling effect occurs between these two layers. A variable voltage is applied to the conducting layer 2b through a transistor 8 for selection by a bit line BL 5. The transistor 8 is controlled by a word line WL 6.

When the variable voltage on the conducting layer 2b is adjusted so that the quantum levels in the conducting layers 2a and 2b are the same, a tunneling current flows between conducting layers 2a and 2b, and the voltage differential between conducting layers 2a and 2b becomes zero, which represents a "0" in a binary state. On the other hand, when the variable voltage on the conducting layer 2b is adjusted so that the quantum levels in the conducting layers 2a and 2c are the same, a tunneling current flows between conducting layers 2a and 2c, and the voltage differential between conducting layers 2a and 2c becomes zero, which represents a "1" in a binary state.

The principles and techniques of the present invention as described hereinabove can be readily applied to provide direct and selective contacts to the individual conducting layers in the three-layer static memory cell described by U.S. Pat. No. 5,625,589.

Figure 6:
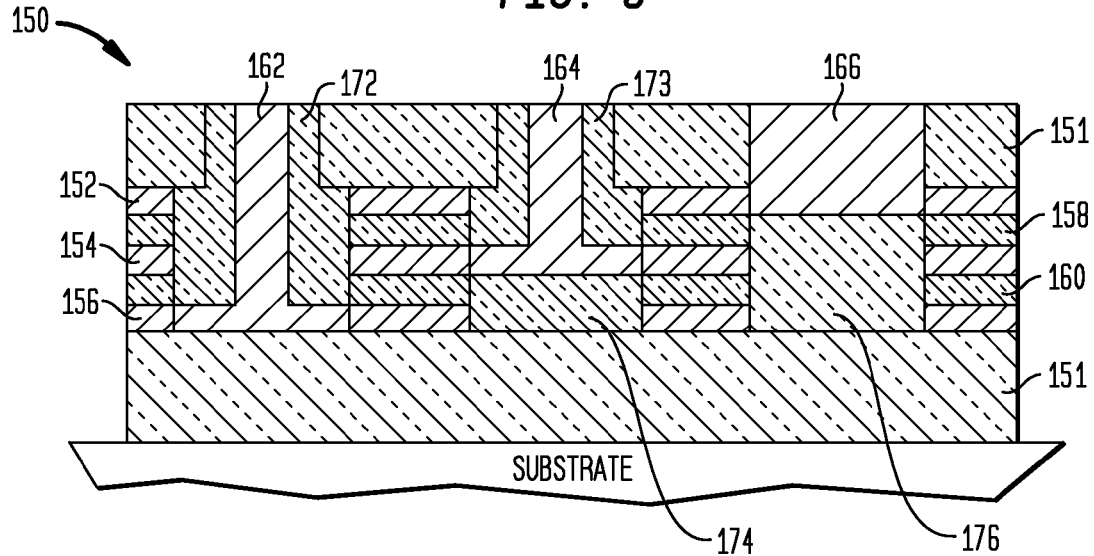
FIG. 6 shows the cross-sectional view of an exemplary three-layer structure that contains three quantum well layers with a direct and selective contact to each quantum well layer, according to one embodiment of the present invention.

FIG. 6 shows an exemplary three-layer device structure 150, which is preferably a static memory cell as described by U.S. Pat. No. 5,625,589. Device structure 150 contains three conducting layers 152, 154, and 156, as sandwiched between or flanked by a top and a bottom peripheral insulating layers 151 and separated from one another by two intermediate insulating layers 158 and 160. A first conductive contact 162 is directly connected to the bottom conducting layer 156 and is isolated from the other two conducting layers 152 and 154 by a dielectric filling 172. A second conductive contact 166 is directly connected to the top conducting layer 152 and is isolated from the other two conducting layers 154 and 156 by a dielectric material layer 176. A third conductive contact 164 is directly connected to the intermediate conducting layer 154 and is isolated from the other two conducting layers 152 and 156 by a dielectric filling 173 and a dielectric material layer 174.

Contacts 162 and 166 can be fabricated using the same processing steps as illustrated by FIGS. 2A-2I and FIGS. 3A-3E. The intermediate contact 164 can be fabricated using similar processing steps. For example, the dielectric material layer 174 can be formed by using the same process for forming the dielectric material layer 176, except that the upper layer of layer 174 should be substantially aligned with the lower surface of the intermediate conducting layer 154. The expanded bottom portion of the T-shaped conductive contact 164 can be formed by using the same process for forming the expanded bottom portion of the T-shaped conductive contact 162, except that the expanded bottom portion of contact 164 should be substantially aligned with the intermediate conducting layer 154. Finally, the dielectric filling 173 and the stem portion of the T-shaped conductive contact 164 can formed by using the same processes for forming the dielectric filling 172 and the stem portion of the T-shaped conductive contact 162.

Therefore, contacts 162, 164, and 166 provide direct and selective connections to individual conducting layers 152, 154, and 156 respectively in the three-layer device structure 150.

Figure 7A:
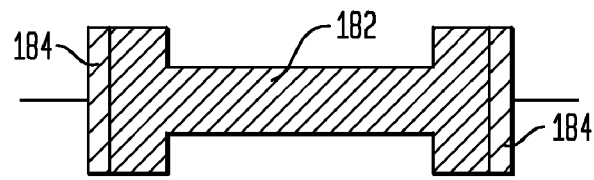
FIGS. 7A and 7B show schematic views of contact configurations with enlarged contact areas, according to one embodiment of the present invention.
Figure 7B:
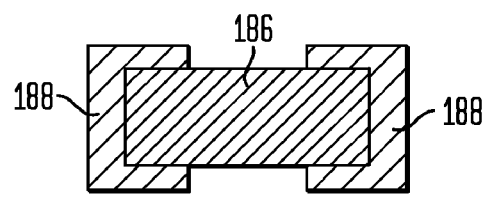

The contact resistance between the conductive contacts and the respective conducting layers may have impact on the tunneling current. In order to minimize the contact resistance to allow maximum tunneling effect, various contact configurations can be used to increase the contact area and to reduce the contact resistance. For example, FIG. 7A shows a dumbbell-shaped contact configuration, which provides increased contact area between the conducting material 182 and the contacts 184; FIG. 7B shows another contact configuration, in which contact 188 covers more than one surfaces of the conducting material 186. More complex contact configurations can be employed to further increase the contact area.

As mentioned hereinabove, fluoride compounds, such as $CdF_2$ and $CaF_2$, are promising materials for forming quantum well structures. The higher energy barrier height of the fluorite-based insulating layer can help achieving better on/off ratio of the device structure at higher temperatures.

The present invention provides a process particularly suitable for fabricating direct and selective contacts for a fluorite-based quantum well device structure, by using lithography, selective etching, and film regrowth techniques.

Figure 8A:
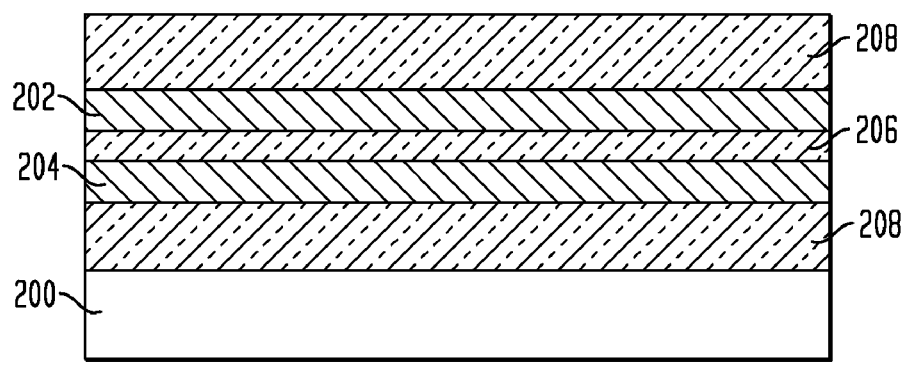
FIGS. 8A-8K illustrates the processing steps for fabricating conductive contacts that are directly and selectively connected with respective top and bottom quantum well layers of a two-layer CQWD structure, according to one embodiment of the present invention.

Specifically, FIG. 8A shows a precursor structure formed on a substrate 200, where the precursor structure comprises two conducting layers 202 and 204 that are sandwiched between a top and a bottom peripheral insulating layers 208 and are isolated from each other by an intermediate insulating layer 206. The top and bottom conducting layers 202 and 204 form two quantum wells for quantum-mechanical confinement of free electrons. The intermediate insulating layer 206 form a tunneling barrier between the top and bottom conducting layers 202 and 204, while the tunneling barrier 206 is sufficiently thin to allow electrons to flow through via tunneling effect when and only when the energy levels in the top and bottom conducting layers 202 and 204 are degenerate.

The conducting and insulating layers 202, 204, 206, and 208 preferably comprise a material selected from the group consisting of $CdF_2$ and $CaF_2$. More preferably, the conducting layers 202 and 204 comprise $CdF_2$, and the insulating layers 206 and 208 comprise $CaF_2$. A silicon substrate is particularly suitable for supporting the $CdF_2/CaF_2$-based quantum well structure.

Figure 8B:
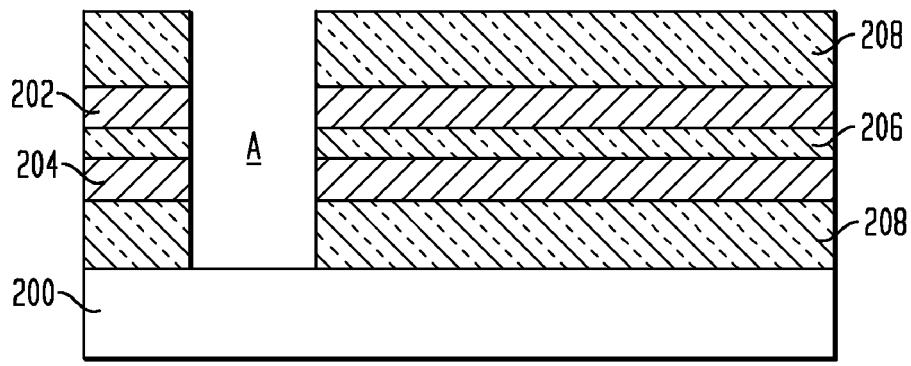

A first pit, pit A, is formed in the precursor structure, as shown in FIG. 8B, by using processing steps similar to those described hereinabove for forming pit A in FIG. 2B.

Figure 8C:
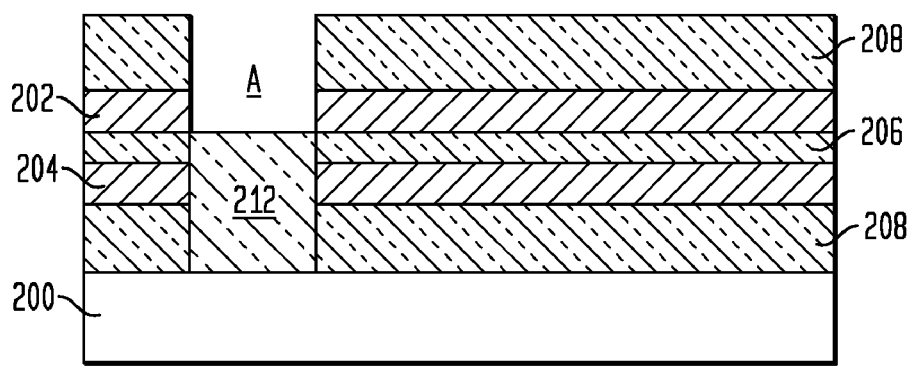
Figure 8D:
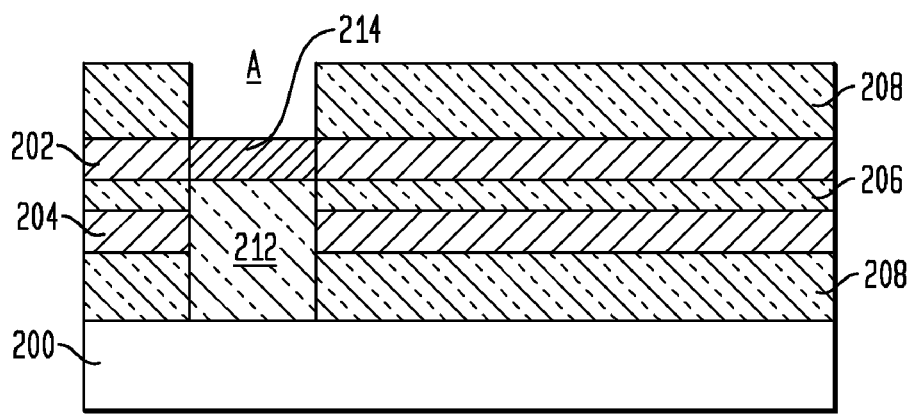
Figure 8E:
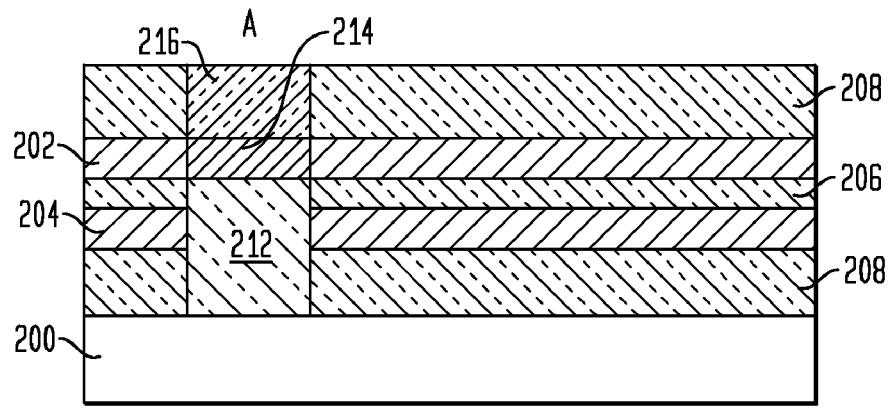

Sequential film regrowth steps are then carried out for regrowing, from bottom to top, a first insulating material layer 212, a conducting material layer 214, and a second insulating material layer 216 in pit A, as shown in FIGS. 8C-8E.

The regrown first and second insulating material layers 212 and 216 contain similar insulating material as that contained by the top and bottom peripheral insulating layers 208 and the intermediate insulating layer 206. The regrown conducting material layer 214 contain similar conducting material as that contained by the top and bottom conducting layers 202 and 204. The upper surface of the first regrown insulating material layer 212 is substantially aligned with the lower surface of the top conducting layer 202, and the upper surface of the regrown conducting material layer 214 is substantially aligned with the upper surface of the top conducting layer 202.

Note that the regrown first insulating material layer 212 does not have to have a perfectly even thickness throughout, and some areas of this layer can be significantly thicker than others. Good electrical insulation of the top conducting layer 202 is established as long as the upper surface of the regrown first insulating material layer 212 is substantially aligned with the lower surface of the top conducting layer 202.

Similarly, the regrown conducting material layer 214 does not have to have a perfectly even thickness throughout, and good electrical contact with the top conducting layer 202 is established as long as the upper surface of the regrown conducting material layer 214 is substantially aligned with the upper surface of the top conducting layer 202.

In the $CdF_2/CaF_2$ embodiment, the average thickness of the regrown first insulating material layer 212 is from about 200 Å to about 600 Å. Preferably, but not necessarily, the regrown first insulating material layer 212 has an average thickness that is substantially similar to the total thickness of the bottom peripheral insulating layer 208, plus the bottom conducting layer 204 plus the intermediate insulating layer 206, as shown in FIG. 8C.

In the $CdF_2/CaF_2$ embodiment, the average thickness of the regrown conducting material layer 214 is from about 10 Å to about 80 Å, more preferably about 40 A. Preferably, but not necessarily, the regrown conducting material layer 214 has an average thickness that is substantially similar to the thickness of the top conducting layer 202, as shown in FIG. 8D.

Figure 8F:
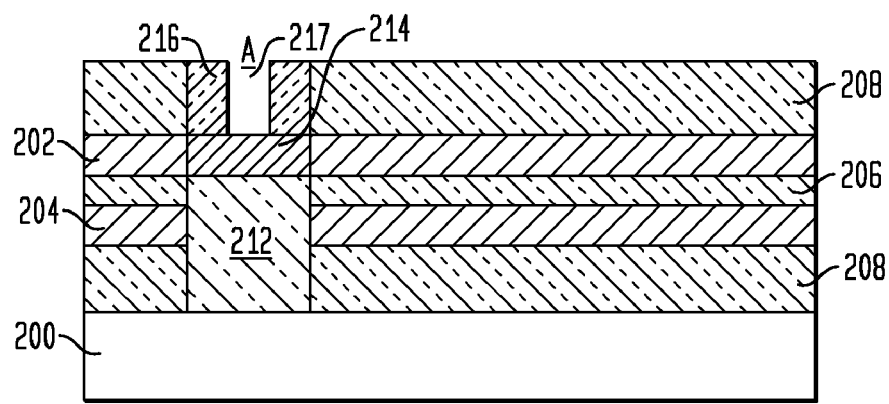
Figure 8G:
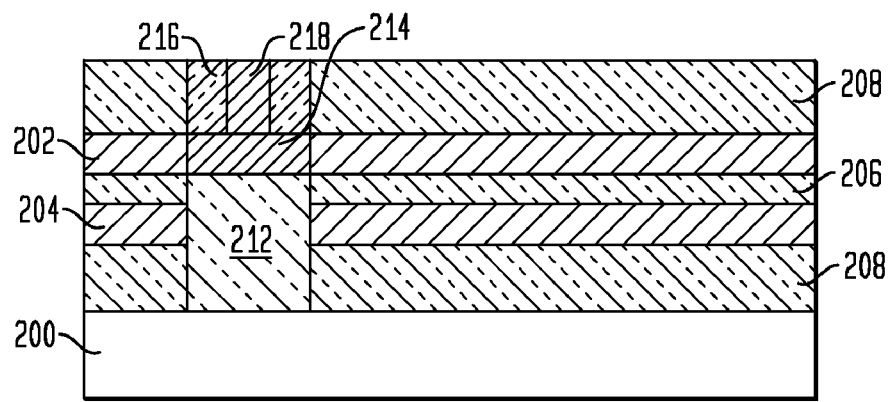

After complete regrowth in pit A, the regrown second insulating material layer 216 is selectively etched to form an isolation via opening 217 in layer 216, as shown in FIG. 8F, by using processing steps similar to those described hereinabove for forming pit A. Subsequently, the isolated via opening 217 is filled with a contact material similar to those described hereinabove, thereby forming a conductive contact 218, as shown in FIG. 8F.

The conductive contact 218 is directly contacted with the top conducting layer 202, which contains an original portion and a regrown portion 214, and it is isolated from the bottom conducting layer 204 by the regrown first insulating material layer 212.

Figure 8H:
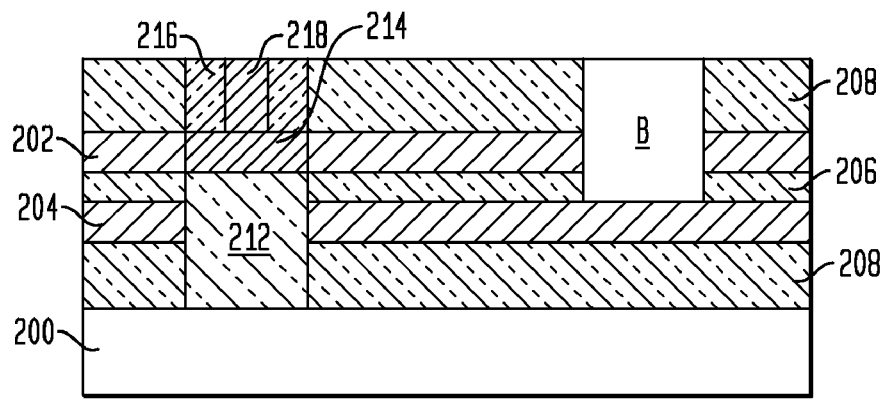

A second pit, pit B, can then be formed in the precursor structure by using processing steps similar to those described hereinabove for forming pit A. Preferably, the etching stops when the upper surface of the bottom conducting layer 204 is exposed, as shown in FIG. 8H. Alternatively, the etching may continue all the way down to the substrate 200, similar to pit A, and a conducting material layer substantially aligned with the bottom conducting layer 204 is regrown over the substrate 200.

Figure 8I:
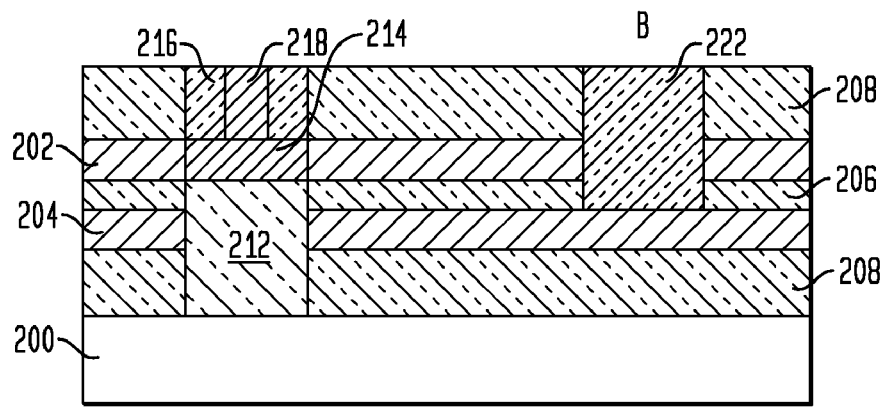

An insulating material layer 222 is then regrown in pit B over the bottom conducting layer 204, as shown in FIG. 8I.

The regrown insulating material layer 222 contains similar insulating material as that contained by the top and bottom peripheral insulating layers 208 and the intermediate insulating layer 206.

Figure 8J:
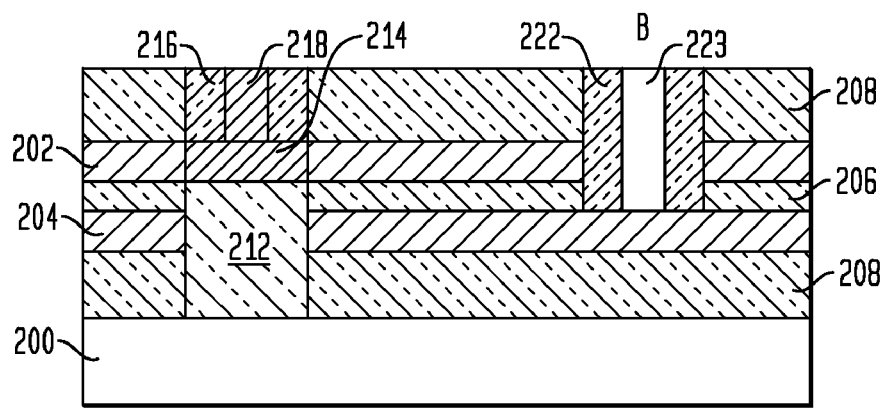
Figure 8K:
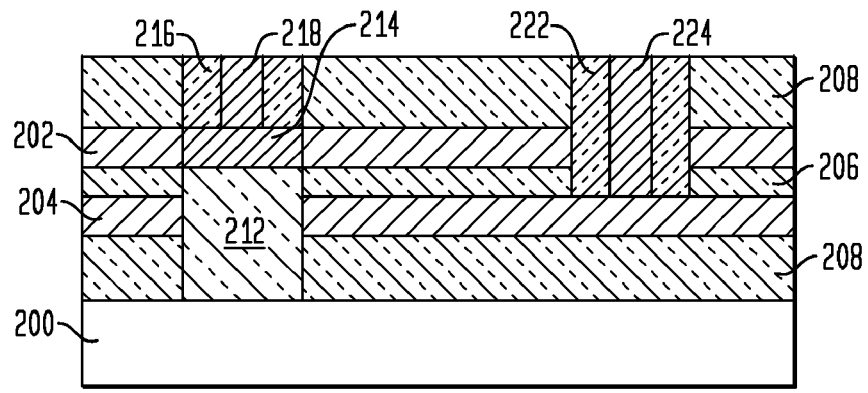

Subsequently, the regrown insulating material layer 222 is selectively etched to form an isolation via opening 223 therein, as shown in FIG. 8J, by using processing steps similar to those described hereinabove for forming isolation via opening 217. Subsequently, the isolated via opening 223 is filled with a contact material similar to those described hereinabove, thereby forming a second conductive contact 224, as shown in FIG. 8K.

The second conductive contact 224 is directly contacted with the bottom conducting layer 204, and it is isolated from the top conducting layer 224 by the regrown insulating material 222.

The principles and techniques of the present invention as described hereinabove can be readily applied to provide direct and selective contacts to the individual conducting layers in a fluorite-based three-layer quantum well device structure.

Figure 9:
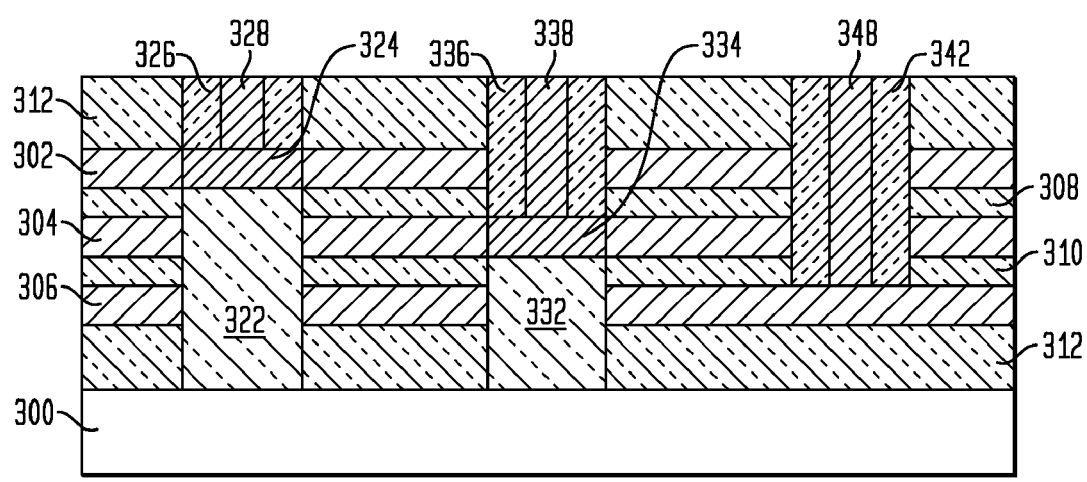
FIG. 9 shows the cross-sectional view of an exemplary three-layer structure that contains three quantum well layers with a direct and selective contact to each quantum well layer, according to one embodiment of the present invention.

FIG. 9 shows an exemplary three-layer device structure, which contains three conducting layers 302, 304, and 306, as sandwiched between or flanked by a top and a bottom peripheral insulating layers 312 and separated from one another by two intermediate insulating layers 308 and 310. A first conductive contact 328 is directly connected to the top conducting layer 302, which contains an original portion and a regrown portion 324. The first conductive contact 328 is isolated from the other two conducting layers 304 and 306 by a regrown first insulating layer 322 and a regrown second insulating layer 326. A second conductive contact 338 is directly connected to the intermediate conducting layer 304, which contains an original portion and a regrown portion 334. The second conductive contact 338 is isolated from the other two conducting layers 302 and 306 by a regrown first insulating layer 332 and a regrown second insulating layer 336. A third conductive contact 348 is directly connected to the bottom conducting layer 306 and is isolated from the other two conducting layers 302 and 304 by a regrown insulating layer 342.

The first and third contacts 328 and 348 can be fabricated using the same processing steps as illustrated by FIGS. 8A-8K. The second contact 338 can be fabricated using processing steps similar to that used for forming the first contact 328, expect that the upper surface of the regrown first insulating layer 332 is aligned with the lower surface of the intermediate conducting layer 304, and the upper surface of the regrown conducting layer 334 is aligned with the upper surface of the intermediate conducting layer 304.

Therefore, contacts 328, 338, and 348 provide direct and selective connections to individual conducting layers 302, 304, and 306 respectively in the three-layer device structure shown in FIG. 9.

Although the above description is provided primarily in terms of CQWD structures, for simplicity and illustration purposes only, the present invention is not limited to CQWD structures, but is broadly applicable to various other quantum-well based structures, such as quantum well lasers, quantum well photodetectors, quantum well solar cells, light-emitting diodes containing multiple quantum wells, quantum well micro-resonators, etc., with or without modifications and variations, as readily determinable by a person ordinarily skilled in the art according to the principles described herein. The other quantum-well based structures as listed hereinabove can be readily prepared using conventional processing techniques that are well known to those skilled in the art, and therefore details concerning their fabrication are not provided herein.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a device structure, comprising:
providing a precursor structure that comprises: (i) two or more conducting layers, (ii) two peripheral insulating layers, and (iii) one or more intermediate insulating layers, wherein said two or more conducting layers are sandwiched between the two peripheral insulating layers and spaced apart from one another by the one or more intermediate insulating layers, forming two or more quantum wells for quantum-mechanical confinement of free electrons; and
fabricating two or more conductive contacts in said precursor structure, wherein each of said conductive contacts is directly and selectively connected with one of the two or more conducting layers, thereby forming a device structure having direct and selective contacts for quantum wells, wherein the two or more conducting layers of the precursor structure each comprise GaAs, wherein the peripheral and intermediate insulating layers of the precursor structure each comprise GaAlAs, and wherein a first conductive contact directly and selectively contacting a lowermost conducting layer of said precursor structure is fabricated by a process comprising:
(a) selectively etching the precursor structure to form a first pit defined by a bottom and multiple sidewalls, wherein the bottom of said first pit exposes an upper surface of the lowermost conducting layer, and wherein the sidewalls of said first pit expose the other conducting layer(s) and the one or more intermediate insulating layers of the precursor structure;
(b) selectively etching the conducting layers in said first pit to expose an upper surface of the peripheral insulating layer that underlies said lowermost conducting layer and to form recesses in the conducting layers, wherein unetched edges of the one or more intermediate insulating layers form one or more protrusions on the sidewalls of the first pit;
(c) selectively etching the one or more intermediate insulating layers in said first pit, so as to eliminate the protrusions on the sidewalls of the first pit and to form an expanded first pit having a narrower, upper portion and a wider, lower portion separated by a projecting edge therebetween;
(d) depositing a layer of a contact material in said expanded first pit by using an angled, collimated beam, wherein the projecting edge between the narrower, upper portion and the wider, lower portion of the expanded first pit provides a deposition stop, so that edges of the deposited layer of contact material are substantially aligned with the lowermost conducting layer;
(e) forming a dielectric filling in the extended first pit over the layer of contact material formed in step (d);
(f) selectively etching the dielectric filling to form an isolated via opening that exposes an upper surface of said layer of the contact material; and
(g) filling the isolated via opening with a contact material, thereby forming the first conductive contact, which is directly connected with the lowermost conducting layer and is isolated from the other conducting layer(s) by the dielectric filling formed in step (e).

2. The method of claim 1, wherein the device structure comprises a first surface and a second surface opposite to the first surface, wherein the two or more conductive contacts each have a terminal on the first surface, but not the second surface, of said device structure.

3. The method of claim 1, wherein the two or more conducting layers of the precursor structure each are characterized by a thickness in a range from about 5 Å to about 500 Å.

4. The method of claim 1, wherein the one or more intermediate insulating layers of the precursor structure each are characterized by a thickness in a range from about 5 Å to about 200 Å.

5. The method of claim 1, wherein steps (a) and (f) are carried out by using ion milling, reactive ion etching, plasma etching, laser etching, or wet etching, and a residue gas analyzer (RGA) is employed for etching control.

6. The method of claim 1, wherein step (b) is carried out by using buffered oxide etch.

7. The method of claim 1, wherein step (c) is carried out by using an etching solution containing one or more etchants selected from the group consisting of hydrogen fluoride.

8. The method of claim 1, wherein a second conductive directly and selectively contacting an uppermost conducting layer of the precursor structure is fabricated by a process comprising:
(a) selectively etching the precursor structure to form a second pit defined by a bottom and multiple sidewalls, wherein the bottom of said second pit exposes the upper surface of the lowermost conducting layer, and wherein the sidewalls of said second pit expose the other conducting layer(s) and the one or more intermediate insulating layers of the precursor structure;
(b) selectively etching the conducting layers at the bottom and sidewalls of said second pit to expose an upper surface of the peripheral insulating layer that underlies said lowermost conducting layer and to form recesses in the conducting layers, wherein unetched edges of the one or more intermediate insulating layers form one or more protrusions on the sidewalls of the second pit;
(c) selectively etching the one or more intermediate insulating layers at the sidewalls of said second pit, so as to eliminate the protrusions on the sidewalls of the second pit and form an expanded second pit having a narrower, upper portion and a wider, lower portion separated by a projecting edge therebetween;
(d) depositing a layer of a dielectric material in said expanded second pit by using an angled, collimated beam, wherein the projecting edge between the narrower, upper portion and the wider, lower portion of the expanded second pit provides a deposition stop, so that edges of the deposited layer of dielectric material are substantially aligned with a lower surface of the uppermost conducting layer;
(e) expanding the narrower, upper portion of the expanded second pit to form a further expanded second pit that has substantially straight sidewalls and is devoid of any projecting edge; and
(f) filling the further expanded second pit with a contact material, thereby forming the second conductive contact, which is directly connected with the uppermost conducting layer and is isolated from the other conducting layer(s) by the layer of dielectric material formed in step (d).

9. The method of claim 8, wherein at least one intermediate conductive contact directly and selectively contacting at least one intermediate conducting layer of the precursor structure is fabricated by a process comprising:

(a) selectively etching the precursor structure to form an intermediate pit defined by a bottom and multiple sidewalls, wherein the bottom of said second pit exposes the upper surface of the lowermost conducting layer, and wherein the sidewalls of said intermediate pit expose the other conducting layer(s) and the one or more intermediate insulating layers;

(b) selectively etching the two or more conducting layers at the bottom and sidewalls of said intermediate pit to expose an upper surface of the peripheral insulating layer that underlies said lowermost conducting layer and to form recesses in the conducting layers, wherein unetched edges of the one or more intermediate insulating layers form one or more protrusions on the sidewalls of the intermediate pit;

(c) selectively etching the one or more intermediate insulating layers at the sidewalls of said intermediate pit, so as to eliminate the protrusions on the sidewalls of the intermediate pit and form an expanded intermediate pit having a narrower, upper portion and a wider, lower portion separated by a projecting edge therebetween;

(d) depositing a layer of a dielectric material in said expanded intermediate pit by using an angled, collimated beam, wherein the projecting edge between the narrower, upper portion and the wider, lower portion of the expanded intermediate pit provides a deposition stop, so that edges of the deposited layer of dielectric material are substantially aligned with a lower surface of the intermediate conducting layer;

(e) depositing a layer of a contact material in said expanded intermediate pit over the layer of insulating material deposited in step (d), by using an angled, collimated beam, wherein the projecting edge between the narrower, upper portion and the wider, lower portion of the expanded intermediate pit provides a deposition stop, so that edges of the deposited layer of contact material are substantially aligned with the intermediate conducting layer;

(f) forming a dielectric filling in the extended intermediate pit over the layer of contact material formed in step (e);

(g) selectively etching the dielectric filling to form an isolated via opening that exposes an upper surface of said layer of the contact material; and (h) filling the isolated via opening with a contact material, thereby forming the intermediate conductive contact, which is directly connected with the intermediate conducting layer and is isolated from the other conducting layer(s) by the layer of dielectric material formed in step (d) and the dielectric filling formed in step (f).

10. A method for forming a device structure, comprising:
providing a precursor structure that comprises: (i) two or more conducting layers, (ii) two peripheral insulating layers, and (iii) one or more intermediate insulating layers, wherein said two or more conducting layers are sandwiched between the two peripheral insulating layers and spaced apart from one another by the one or more intermediate insulating layers, forming two or more quantum wells for quantum-mechanical confinement of free electrons; and fabricating two or more conductive contacts in said precursor structure, wherein each of said conductive contacts is directly and selectively connected with one of the two or more conducting layers, thereby forming a device structure having direct and selective contacts for quantum wells, wherein the conducting layers of the precursor structure each comprise $Cdf_2$, wherein the peripheral and intermediate insulating layers of the precursor structure each comprise $CaF_2$, and wherein a first conductive directly and selectively contacting a lowermost conducting layer of said precursor structure is fabricated by a process comprising:

(a) selectively etching the precursor structure to form a first pit defined by a bottom and multiple sidewalls, wherein the bottom of said first pit exposes an upper surface of the lowermost conducting layer, and wherein the sidewalls of said first pit expose the other conducting layer(s) and the one or more intermediate insulating layers;

(b) regrowing an insulating material over the lowermost conducting layer in said first pit;

(c) selectively etching the regrown insulating material to form an isolated via opening that exposes the upper surface of said lowermost conducting layer; and (d) filling the isolated via opening with a contact material, thereby forming the first conductive contact, which is directly connected with the lowermost conducting layer and is isolated from the other conducting layer(s) by the insulating material regrown in step (b), and wherein a second conductive directly and selectively contacting an uppermost conducting layer of the precursor structure is fabricated by a process comprising:

(a') selectively etching the precursor structure to form a second pit defined by a bottom and multiple sidewalls, wherein the bottom of said second pit exposes the upper surface of the lowermost conducting layer, and wherein the sidewalls of said second pit expose the other conducting layer(s) and the one or more intermediate insulating layers;

(b') regrowing a first layer of insulating material over the lowermost conducting layer in said second pit, wherein an upper surface of said first layer of insulating material is substantially aligned with a lower surface of the uppermost conducting layer;

(C') regrowing a layer of conducting material over the first layer of insulating material in said second pit, wherein an upper surface of said layer of conducting material is substantially aligned with an upper surface of the uppermost conducting layer;

(d') regrowing a second layer of insulating material over the layer of conducting material to fill said second pit;

(e') selectively etching the regrown second layer of insulating material to form an isolated via opening that exposes the upper surface of said layer of conducting material as regrown in step (c'); and (f') filling the isolated via opening with a contact material, thereby forming the second conductive contact, which is directly connected with the uppermost conducting layer and is isolated from the other conducting layer(s) by the first layer of insulating material regrown in step (b') and the second layer of insulating material regrown in step (d').

11. The method of claim 10, wherein at least one Intermediate conductive contact directly and selectively contacting at least one intermediate conducting layer of the precursor structure is fabricated by a process comprising:

(a) selectively etching the precursor structure to form an intermediate pit defined by a bottom and multiple sidewalls, wherein the bottom of said second pit exposes the upper surface of the lowermost conducting layer, and wherein the sidewalls of said intermediate pit expose the other conducting layer(s) and the one or more intermediate insulating layers;

(b) regrowing a first layer of insulating material over the lowermost conducting layer in said intermediate pit, wherein an upper surface of said first layer of insulating material is substantially aligned with a lower surface of the intermediate conducting layer;

(c) regrowing a layer of conducting material over the first layer of insulating material in said intermediate pit, wherein an upper surface of said layer of conducting material is substantially aligned with an upper surface of the intermediate conducting layer;

(d) regrowing a second layer of insulating material over the layer of conducting material to fill said intermediate pit;

(e) selectively etching the regrown second layer of insulating material to form an isolated via opening that exposes the upper surface of said layer of conducting material as regrown in step (c); and (f) filling the isolated via opening with a contact material, thereby forming the intermediate conductive contact, which is directly connected with the intermediate conducting layer and is isolated from the other conducting layer(s) by the first layer of insulating material regrown in step (b) and the second layer of insulating material regrown in step (d).

* * * * *